United States Patent
Bergstrom

(10) Patent No.: US 11,903,135 B2
(45) Date of Patent: Feb. 13, 2024

(54) HOLDER ARRANGEMENT

(71) Applicant: Mycronic AB, Taby (SE)

(72) Inventor: Johan Bergstrom, Bromma (SE)

(73) Assignee: Mycronic AB, Taby (SE)

( * ) Notice: Subject to any disclaimer, the term of this patent is extended or adjusted under 35 U.S.C. 154(b) by 368 days.

(21) Appl. No.: 17/276,347

(22) PCT Filed: Oct. 23, 2019

(86) PCT No.: PCT/EP2019/078813
§ 371 (c)(1),
(2) Date: Mar. 15, 2021

(87) PCT Pub. No.: WO2020/083968
PCT Pub. Date: Apr. 30, 2020

(65) Prior Publication Data
US 2022/0078957 A1 Mar. 10, 2022

(30) Foreign Application Priority Data
Oct. 23, 2018 (EP) .................................... 18201892

(51) Int. Cl.
*H05K 13/04* (2006.01)
(52) U.S. Cl.
CPC ................................ *H05K 13/0419* (2018.08)
(58) Field of Classification Search
CPC ........... H05K 13/0417; H05K 13/0419; H05K 13/02; Y10T 156/1994; Y10T 29/52
See application file for complete search history.

(56) References Cited

U.S. PATENT DOCUMENTS

2003/0046808 A1* 3/2003 Eskang .............. H05K 13/0417
29/650
2013/0161371 A1 6/2013 Nagao et al.

FOREIGN PATENT DOCUMENTS

| EP | 1298977 A1 | 4/2003 |
| EP | 1438884 | 7/2004 |
| WO | WO-03024181 A1 | 3/2003 |

OTHER PUBLICATIONS

International Search Report PCT/ISA/210 for International Application No. PCT/EP2019/078813 dated Oct. 23, 2019.

* cited by examiner

*Primary Examiner* — George R Koch
(74) *Attorney, Agent, or Firm* — Harness, Dickey & Pierce, P.L.C.

(57) ABSTRACT

A holder arrangement for releasably holding a plurality of component feeders, configured to feed a component tape towards a picking position of a component mounting machine, is disclosed. The arrangement comprises a first mechanical interface configured to releasably attach the plurality of component feeders to the holder arrangement, and a second mechanical interface configured to releasably attach the holder arrangement to a component tape magazine configured to be loaded into the component mounting machine, such that the component feeders are positioned to guide the component tape to the picking position. Furthermore, a method for handling at least one component feeder, is disclosed.

16 Claims, 6 Drawing Sheets

HOLDER ARRANGEMENT

CROSS-REFERENCE TO RELATED APPLICATIONS

This application is a national phase under 35 U.S.C. § 371 of PCT International Application No. PCT/EP2019/078813 which has an International filing date of Oct. 23, 2019, which claims priority to European Patent Application No. 18201892.9, filed Oct. 23, 2018, the entire contents of each of which are hereby incorporated by reference.

TECHNICAL FIELD

The present inventive concept generally relates to the field of manufacture and assembly of circuit card assemblies. In particular, the present inventive concept relates to a holder arrangement for releasably holding a plurality of component feeders to be used in a component mounting machine.

BACKGROUND

Surface Mount Technology (SMT) relates to methods for automated production of circuit card assemblies. This technology commonly involves a component mounting machine, such as a pick-and-place machine, for placing the electronic components on designated positions on a workpiece, such as a printed circuit board (PCB).

The electronic components may be provided by means of a component tape formed of a lower carrier comprising compartments accommodating the electronic components, and an upper, protective cover tape keeping the electronic components in place. The component tape may be wound on a reel and stored in a magazine, configured be inserted into the component mounting machine.

The free end of the component tape may be introduced into a feeding mechanism, often referred to as a component feeder, configured to guide the component tape to a picking position in which the component is exposed to a picking tool of the component mounting machine.

The presently used magazines are configured to hold a plurality of feeders and reels. There is however an upper limit for the number of components reels and feeders the magazine can accommodate before it gets too heavy and bulky for an operator to handle. One attempt to address this issue has been to employ carts or trolleys for transporting and docking the magazines with the component mounting machine. Alternatively, the component reels and the feeders may be transported and loaded into the component mounting machine one by one, which is a cumbersome and time consuming process.

Hence, there is a need for an improved technology that facilitates the handling and loading of electronic components into the component mounting machine.

SUMMARY

An objective of the present inventive concept is therefore to at least partially address the above drawbacks with the prior art. This and other objectives are achieved by means of a holding arrangement as defined in the independent claim. Further embodiments of the present disclosure are provided in the dependent claims.

According to a first configuration of a first aspect of the present disclosure there is provided a holder arrangement for releasably holding a plurality of component feeders. The component feeders may be configured to feed a component tape towards a picking position of a component mounting machine. The arrangement may include a first mechanical interface configured to attach the plurality of component feeders to the holder arrangement, and a second mechanical interface configured to releasably attach the holder arrangement to a component tape magazine configured to be loaded into the component mounting machine.

According to a second configuration of the first aspect of the present disclosure, the is provided a holder arrangement for releasably holding a plurality of component feeders. The holder arrangement may be configured to feed a component tape towards a picking position of a component mounting machine. The arrangement may include a first mechanical interface configured to attach the plurality of component feeders to the holder arrangement, and a second mechanical interface configured to releasably attach the holder arrangement to a component tape magazine configured to be loaded into the component mounting machine, such that the component feeders are positioned to guide the component tape to the picking position.

According to a third configuration of the first aspect of the present disclosure, the is provided a holder arrangement for releasably holding a plurality of component feeders. The holder arrangement may be configured to feed a component tape towards a picking position of a component mounting machine. The arrangement may include a first mechanical interface configured to attach the plurality of component feeders to the holder arrangement when said plurality of component feeders guide the component tape to the picking position, and a second mechanical interface configured to releasably attach the holder arrangement to a component tape magazine configured to be loaded into the component mounting machine.

According to a fourth configuration of the first aspect of the present disclosure, the is provided a holder arrangement for releasably holding a plurality of component feeders. The holder arrangement may be configured to feed a component tape towards a picking position of a component mounting machine. The arrangement may include a first mechanical interface configured to attach the plurality of component feeders to the holder arrangement, and a second mechanical interface comprising a first locking element and a second locking element and configured to releasably attach the holder arrangement to a component tape magazine configured to be loaded into the component mounting machine.

The present inventive concept allows for an operator of the surface mounting machine to transport and handle a plurality of component feeders in a simplified and more flexible way. By attaching the component feeders to a holder arrangement that can be releasably attached to the component tape magazine, i.e., handled as a unit separate from the magazine, the plurality of component feeders can be handled as a bundle. Thus, the holder arrangement allows for the operator to remove, transport and load the plurality of component feeders as a group of component feeders, or a single unit, rather than one by one. Further, the holder arrangement allows for the plurality of feeders to be transported to and from the component mounting machine without having to transport the entire magazine. In other words, the operator can move a plurality of feeders in a single step without having to involve the entire magazine.

The holder arrangement can be configured to hold all component feeders, or a subset of the number of component feeders that can be loaded in the magazine. Attaching a subset of feeders to the holder arrangement may provide a more flexible handling and loading of component into the component mounting machine, allowing different combinations (or subsets) of component feeders to be loaded in a single magazine.

As already mentioned, the holder arrangement is configured to releasably hold a plurality of component feeders, and to be releasably attached to the component tape magazine. This may be understood as a capability to allow the component feeders to be arranged in a fixed state and in a released state. In the fixed state, the feeders can assume a fixed position in which they cannot be moved relative the holder arrangement, or detached from the same, without the application of considerable force. Put differently, the fixed position may be understood as a state in which movement or detachment of the component feeders from the holder arrangement is prevented during normal use of the component feeders and of the holder arrangement. In the released state, however, the feeders are allowed to be removed or detached from the holder arrangement by the operator of the component mounting machine.

This reasoning also applies to the releasable attachment of the holder arrangement to the component tape magazine, wherein the holder arrangement has the capability of being arranged in a fixed state relative the component tape magazine, and in a released state in which it can be removed from the magazine.

The holder arrangement may be in the form of a single piece. Thus, the holder arrangement may be configured to be released as a single piece from a component mounting machine. The first and second mechanical interfaces may be connected to each other, such as connected to each other via connection means. The connection means may be in the form of at least one, such as two, side bars extending in the feeding direction of the component feeders.

The term component feeder generally refers to a device or structure for guiding the component tape into a position in which the components carried by the tape can be accessed and picked by the component mounting machine. Preferably, the component feeder may be configured to expose the compartments of the component tape prior to the picking, for example by means of an exposure member that removes the cover tape from the lower carrier tape. The component feeder may in some examples be a passive means for guiding or directing the component tape to the picking position, or an active component further including a driving mechanism for advancing the tape towards the picking position. In case of a passive component feeder, the driving mechanism may be provided in the magazine instead.

The component mounting machine may be configured to pick the component at the picking position and place it on a designated or intended position on a workpiece. The term workpiece may, inter alia, refer to a printed board, a printed wiring board or a printed circuit board (PCB) onto which one or more electronic components are to be mounted. Those terms are interchangeably used throughout the present application. An assembled workpiece, i.e., a workpiece populated with electronic components, may be referred to as a circuit card assembly, printed circuit board assembly (PCBA), or printed circuit assembly (PCA).

The term magazine may refer to a unit capable of accommodating a plurality of feeders and component tape reels, and which can be inserted (or loaded) in a component mounting machine and removed from the same.

Preferably, a plurality of magazines may be used, which may be interchangeable between different component mounting machines in order to provide a more flexible use of the available component types and to improve production planning and optimization.

According to an embodiment, the first mechanical interface may comprise a first locking means and a second locking means. The first locking means may be configured to cooperate with the second locking means to releasably attach the plurality of component feeders to the holder arrangement. The first locking means and the second locking means may be separated from each other in a feeding direction of the component feeders, i.e., the direction in which the component tape may be guided towards the picking position of the component mounting machine. The feeding direction may, in some examples, also be referred to as a length direction of the component feeders.

An example of cooperation between the first locking means and the second locking means includes a configuration in which the first locking means is configured to push the component feeders towards the second locking means so as to restrain the component feeders therebetween.

By employing a first mechanical interface with two separate attachment points, such as a first locking means and a second locking means separated in the length direction of the component feeder, the component feeders may be engaged between the first and second locking means so as to achieve a relatively stable and robust attachment to the holder arrangement. Advantageously, this may improve the precision with which the component is guided to the picking position.

According to an embodiment, the first locking means may comprise a plurality of locking members, each of which being configured to cooperate with the second locking means to releasably attach a respective component feeder to the holder arrangement. Thus, each one of the component feeders may be associated with a respective locking member, thereby allowing for an individual engagement to the holder arrangement.

The locking members may for example comprise retaining balls, pins, bolts, arms or latches, which may be spring loaded so as to facilitate engagement with the component feeders.

According to an embodiment, the locking members may be spring loaded to exert a force pushing the respective component feeder towards the second locking means. By spring loading the locking members, the force exerted by the locking members may be employed to retain the component feeders in the holder arrangement during use. Further, the spring loading can be dimensioned so as to allow the locking members to release the feeders when desired, for example by allowing the operator to counteract the locking force exerted by the locking member and thereby release the component feeder from the holder arrangement. A proper dimensioning of the spring loading thus allows for the component feeders to be safely attached to the holder arrangement during use and yet be easily removed by the operator.

According to an embodiment, the locking members may be pivotable, preferably around an axis oriented traverse to the feeding direction, such as for example substantially orthogonal to the feeding direction. This allows for the locking members to rotate in a direction pushing the feeders towards the second locking means, thereby engaging the feeders in the holder arrangement, and in an opposite direction for releasing the feeders from the holder arrangement. Further, the pivoting motion allows for the locking members to handle component tapes of different thickness.

According to an embodiment, a position of the locking members may be adjustable in a manner that allows the holder arrangement to receive component feeders of different sizes. In one example, the position of the locking members may be adjusted in a sideway direction relative the feeding direction, i.e., along the width of the component tape. Put differently, the lateral pitch of the plurality of locking members may be adjusted to meet the width of the specific feeders (or component tapes) to be loaded. The holder arrangement may be in some examples be configured for component feeders holding tapes of widths in the interval of for example 4 to 32 mm, such as for example tapes of 4, 8, 12, 16 or 32 mm.

According to an embodiment, the locking members may comprise an interlocking structure configured to cooperate with a corresponding interlocking structure of the respective component feeder and to allow the component feeder to be snapped into a locking position, in which the component feeder is attached to the holder arrangement. Examples of interlocking structures may include a protrusion and a groove adapted to engage or fit with each other so as to provide a mutually interlocking attachment. A snap attachment, also referred to as a "click" attachment, may be understood as an assembly technique in which a protrusion, such as for example a rib or shoulder, is pushed over a corresponding structure, such as for example a shoulder, to accomplish an attachment. The snap attachment may in some examples be facilitated by the locking members being configured to give way when pushed into the locked position. This may for example be achieved by the locking members being slightly resilient or flexible, and/or biased by a spring mechanism. Further examples of protrusions may include spring loaded retaining balls or bolts similar to the structures discussed above.

The snap attachment is advantageous in that it allows for a relatively fast and easy loading and unloading of the feeders, especially compared to other techniques involving for example screws and latches.

According to an embodiment, the first mechanical interface may be configured to hold the plurality of component feeders side by side, as seen in the width direction of the component tape. This allows for the component feeders to feed the component to picking positions that are arranged along a common line and in a common plane, which in turn facilitates the picking of the components.

According to an embodiment, the holder arrangement may be configured to hold the plurality of component feeders when a component tape is mounted in at least one, and preferably all, of the component feeders. Thus, the holder arrangement may be configured to receive and hold a component feeder that is already attached to a component tape and, possibly, the reel carrying the component tape. The holder arrangement may hence be configured to allow the plurality of feeders it is holding to be stored and transported to and from the component tape magazine together with the attached component tapes.

According to an embodiment, the second locking means may be configured to allow a pivotal engagement with the component feeders. In one example, a component feeder may be mounted in the holder arrangement by engaging a first portion of the feeder in the second locking means, and then push or snap a second portion of the component into engagement with the corresponding locking member. The pivotal, rotating motion around the second locking means may facilitate the snapping of the component feeder into the attached position.

According to an embodiment, the second locking means may comprise a rod or bar extending in a direction transverse to the feeding direction. The rod or bar may further be configured to fit a corresponding recess of the component feeders in order to provide an engagement. The rod or bar shape of the second locking means allows for a plurality of component feeders to be arranged side by side, as seen in a width direction of the component tape, along the second locking means.

According to an embodiment, the second mechanical interface may comprise a first locking element and a second locking element, wherein at least one of said first and second locking elements is configured to be snapped into a locking position in which the holder arrangement is attached to the component tape magazine. The snap attachment may be similarly configured as the snap attachment discussed in connection with the above embodiment. Thus, the entire holder arrangement may be loaded into a magazine, and removed from the same, in a manner that is relatively fast and simple.

According to an embodiment, the second mechanical interface may be further configured to releasably attach the holder arrangement to a portable carrier or bin configured to hold a plurality of component tape reels. The bin may be used for accommodating or holding a subset of the feeders and component tape reels that can be loaded into the magazine so as to facilitate transport of the component reels and increase the flexibility in terms of possible combinations of component types that can be used during production. Alternatively, the bin may be configured to hold all feeders and component reels that can be accommodated by the magazine, thereby allowing for a change of components (loaded into the component mounting machine) without having to move or change the entire magazine. Thus, the bin may be employed to increase the flexibility of the production system (involving components, magazines and component mounting machines) and to make it easier for the operator to transport and load the desired components.

The carrier may form a removable part of the magazine. This allows for the second mechanical interface to releasably attach the holder arrangement to the component mounting machine via the carrier, which in turn is connected to the magazine.

The present embodiment is advantageous in that is allows for the bin, the component tapes and their respective component feeders to be transported and handled as a unit. The operator may simply release the holder arrangement from the component mounting machine, attach it to the bin instead, and remove the bin and the bundle of feeders in a single move. Alternatively, the holder arrangement may be attached to the carrier when the magazine is loaded in the component mounting machine, which allows the operator to release the component feeders from the component mounting machine while still being attached to the carrier, and remove the carrier and the bundle of feeder as a single unit.

According to a second aspect of the present inventive concept, a component mounting machine is provided. The component mounting machine may comprise a holder arrangement according to any one of the previous embodiments discussed in connection with the first aspect, and a component tape magazine comprising a drive mechanism for moving the component tape mounted in at least one of the plurality of component feeders towards the picking position of the component mounting machine.

It is appreciated that the component mounting machine according to this aspect may be combined with any of the above embodiments, that it may be used in combination with the previously described bin, and that it may generally present the same or corresponding advantages as previously described.

According to a first configuration of a third aspect, a method is provided for handling a plurality of component feeders. The method may comprise a step of releasably attaching each one of the component feeders to a first mechanical interface of a holder arrangement, wherein the first mechanical interface may comprise a plurality of locking members and a second locking means. Each one of the locking members may be configured to cooperate with the second locking means to releasably attach a respective one of the component feeders. The method may further comprise a step of releasably attaching the holder arrangement to a component tape magazine configured to be loaded into a component mounting machine.

According to a second configuration of a third aspect, a method is provided for handling at least one component feeder configured to feed a component tape towards a picking position of a component mounting machine. In the method, the at least one component feeder may be arranged to be releasably held by a holder arrangement. The method may comprise a step of attaching the at least one component feeder to the holder arrangement by means of a first mechanical interface, and may comprise a step of attaching the holder arrangement to a tape bin by means of a second mechanical interface. The method may comprise a step of carrying the tape bin to the tape magazine and moving the tape bin into the magazine configured to be loaded into the component mounting machine. Further, the method may comprise a step of detaching the holder arrangement from the tape bin and attaching said holder arrangement to the magazine by means of the second mechanical interface. Finally, the method may comprise a step of loading the magazine into the component mounting machine for at least one component feeder to feed the component tape to the picking position of the component mounting machine.

The present aspect can be combined with each one of the previously described aspects and embodiments, and is associated with the same of similar effects and advantages as discussed in connection with those embodiments.

Further objectives of, features of, and advantages with the present inventive concept will become apparent when studying the following detailed disclosure, the drawings and the appended claims. Those skilled in the art will realise that different features of the present inventive concept can be combined to create embodiments other than those described in the following.

BRIEF DESCRIPTION OF THE DRAWINGS

The above, as well as additional objects, features, advantages and applications of the inventive concept, will be better understood through the following illustrative and non-limiting detailed description of embodiments. Reference is made to the appended drawings, in which.

Figure 1:
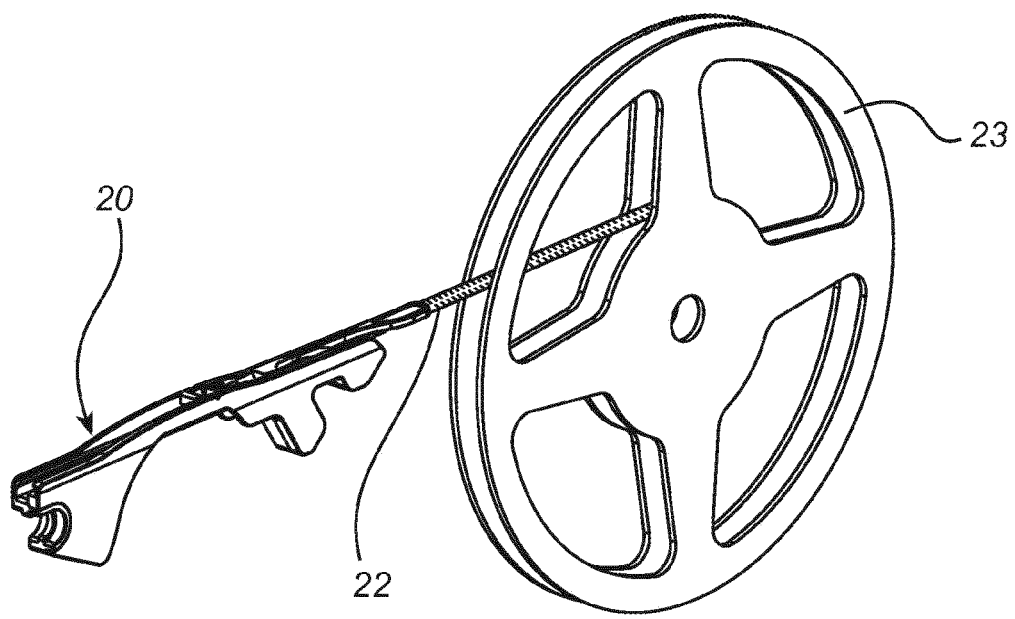
FIG. 1 illustrates the general relationship between a component feeder, a component tape, and a component tape reel.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may be exaggerated for illustrative purposes and, thus, are provided to illustrate the general structures of the embodiments.

DETAILED DESCRIPTION

Exemplifying embodiments will now be described more fully hereinafter with reference to the accompanying drawings. The drawings show currently preferred embodiments, but the inventive concept may, however, be embodied in many different forms and should not be construed as limited to the embodiments set forth herein.

Embodiments of the present inventive concept generally relate to a holder arrangement for releasably holding a plurality of component feeders. These feeders may provide components to a picking position in a component mounting machine, where the components can be picked and subsequently placed on a workpiece, such as a printed wire board, by a pick-up head of the machine. The mounting machine may often be referred to as a pick-and-place (PnP) machine. Such a system generally comprises a component feeder 20 (also referred to as a tape guide), a component tape 22 and a component tape reel 23. In use, the component tape 22 may be wound onto component tape reel 23 and loaded into the component feeder 20, as is illustrated in for example FIG. 1. The component feeder 20 may then be mounted into a component mounting machine, or into a magazine 40 (not shown in FIG. 1) for subsequent loading into a component mounting machine.

Figure 2A:
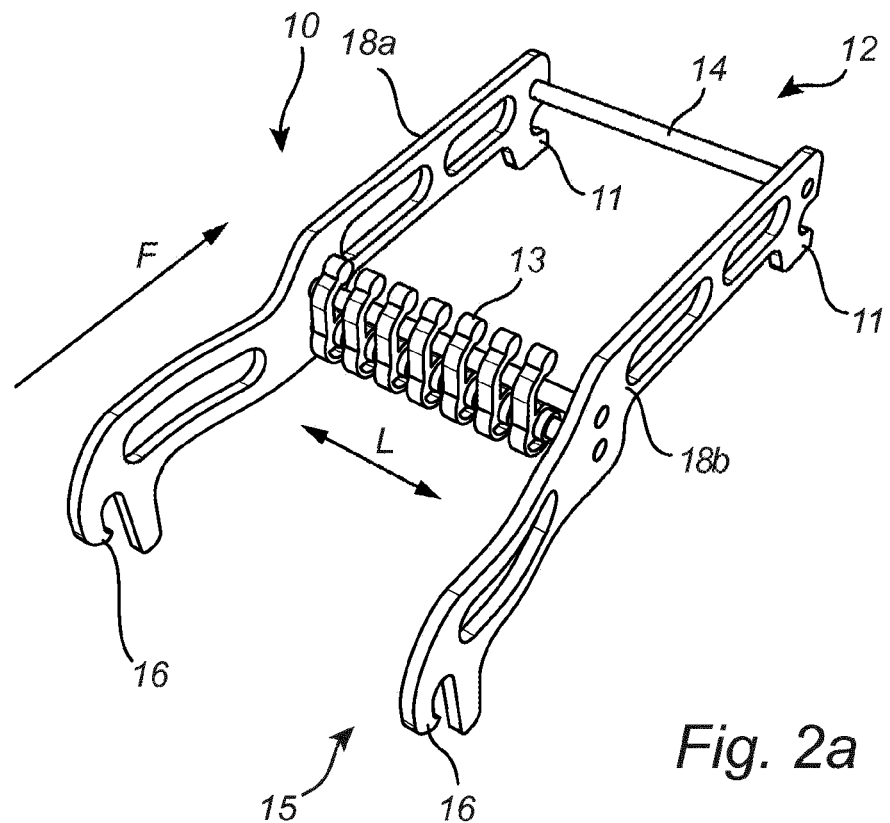
FIGS. 2a-b illustrate perspective views of a holder arrangement according to some embodiments of the present disclosure.

With reference to FIG. 2a, a holder arrangement 10 for releasably holding a plurality of component feeders according to an embodiment is shown. The holder arrangement 10 comprises a first mechanical interface 12 and a second mechanical interface 15. In the present example, the first mechanical interface 12 forms the part of the holder arrangement 10 to which the component feeders may be attached, whereas the second mechanical interface 15 forms the part of the holder arrangement 10 that may be used for attaching the holder arrangement 10 to a component tape magazine (not shown in the present figure).

In the particular example illustrated in the present figure, the first mechanical interface 12 may comprise a first locking means 13 and a second locking means 14 for releasably attaching the plurality of component feeders to the holder arrangement 10. The first locking means 13 comprises a plurality of locking members in the form of locking arms 13 arranged to cooperate with the second locking means 14. The second locking means 14 may be separated from the locking arms 13 in a feeding direction F of the component tape to allow the component feeders (not shown in this figure) to be attached in between.

The second mechanical interface 15 may comprise a first locking element 11 arranged to be fitted with a corresponding attachment structure of the component tape magazine (or carrier; this will be described in connection with FIGS. 4 and 6), and a second locking element 16 configured to be engaged with another corresponding structure of the component tape magazine (or carrier). In the particular example shown in FIG. 1, the second locking element 16 may attach the holder arrangement 10 to the magazine by means of a snap attachment.

The holder arrangement 10 may, according to the present embodiment, be formed of two side parts 18a, 18b that extend in the feeding direction F of the component tape and are connected to each other by means of two rods—a first rod holding the first locking means 13, and a second rod forming the second locking means 14. The rods may be arranged to extend in a lateral direction L, i.e., in a width direction of the component tape. The first locking means 13 may be formed as locking arms 13, which may be articulately connected to the first rod, such that they can be moved between a position that engages the feeders and a position in which the feeders are released. Preferably, the locking arms 13 may be biased towards the second locking means 14 in order to ensure a safe attachment of the feeders. The biasing may be achieved by an inherent resilience or flexibility of the material forming the locking arm 13, or by means of a spring pushing the locking arm 13 towards the second locking means 14.

The side parts 18a, 18b may comprise recesses or through-holes to reduce the weight of the holder arrangement 10. The side parts 18a, 18b form connection means, thus connecting the first 12 and second 15 mechanical interfaces. The holder arrangement 10 is thus in the form of a single piece or single unit, i.e. configured to be released from a component mounting machine as a single piece or single unit.

Figure 2B:
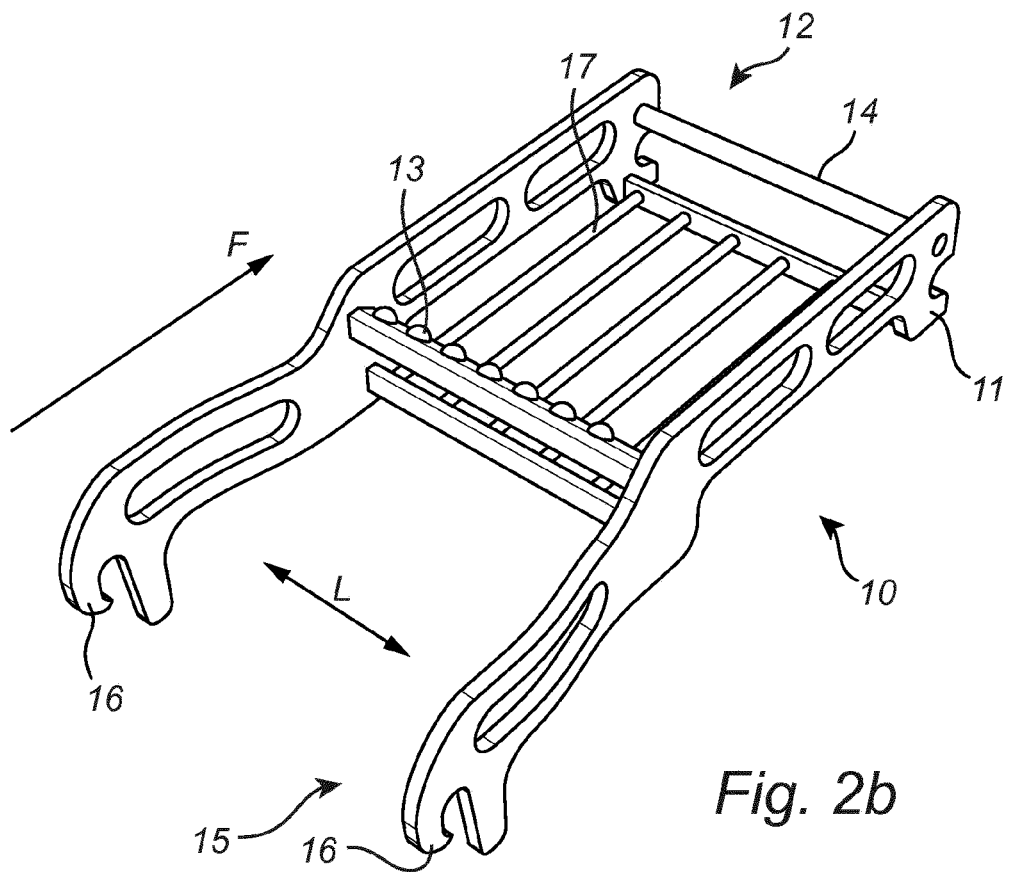

FIG. 2b illustrates a similar holder arrangement 10 as the one shown in FIG. 2a. In this embodiment, however, the first locking means 13 may comprise a plurality of spring loaded retaining balls 13 for engaging the component feeders. Further, the holder arrangement 10 may comprise a plurality of bars 17. The bars 17 may be arranged in a grid structure for increasing the form stability of the holder arrangement. In the present example, the reinforcing grid structure extends between the first locking means 13 and the second locking means 14, i.e., along the feeding direction F. Other configurations and designs may however be employed. The holder arrangement 10 may for example be formed of a general framework, which for example may be a molded or milled item, configured to support the first mechanical interface 12.

Figure 3:
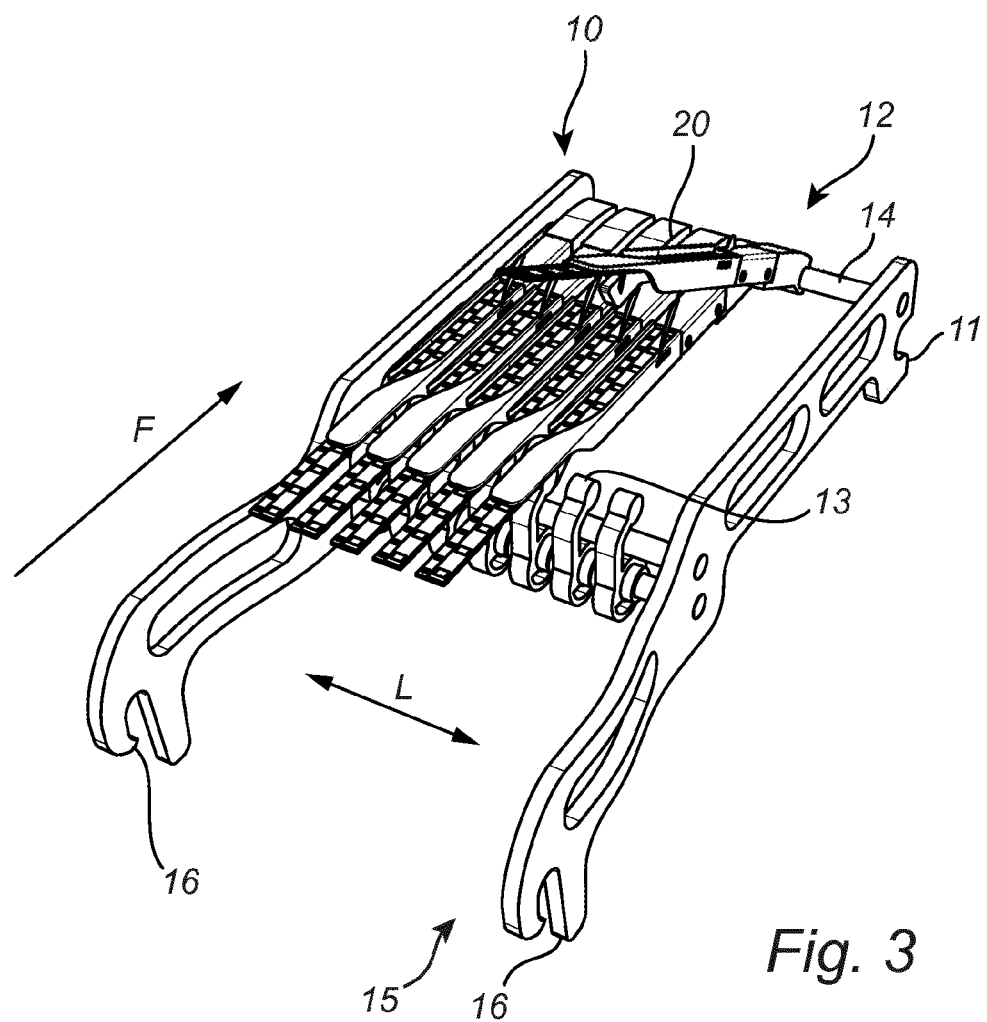
FIG. 3 illustrates a perspective view of the holder arrangement with feeders mounted according to an embodiment of the present disclosure.

FIG. 3 illustrates a holder arrangement 10 that may be similarly configured as the holder arrangement shown in FIG. 2. In this example, the holder arrangement 10 is illustrated with component feeders 20 attached, or about to be attached, to the first mechanical interface 12. The second locking means 14 may be configured to fixate the one or more component feeders 20 at a first portion of the feeder, in this example the front portion as seen in the feeding direction F, and guide the feeder into the right position when it is being pushed into engagement with the first locking means 13, such as locking arms 13. The locking arms 13 may be spring loaded to exert a force on the component feeders 20 in the feeding direction F and fixate the feeders 20 in an attached position. Thus, the spring loaded locking arms 13 may be configured to cooperate with the fixation means 14 to maintain the feeders in the engaged, attached state.

As shown in FIG. 3, the first locking means 13 and the second locking means 14 may be arranged to hold the plurality of component feeders 20 side by side in the width direction L of the component tape 22, which corresponds to the position and orientation the feeders may have when loaded in the component mounting machine.

The first locking means 13 may comprise a plurality of locking members 13 that are adjustable along a lateral direction L of the holder arrangement 10, i.e., along a first rod holding the locking arms 13 shown in FIG. 3, to allow the holder arrangement to fit feeders 20 of different widths.

Figure 4:
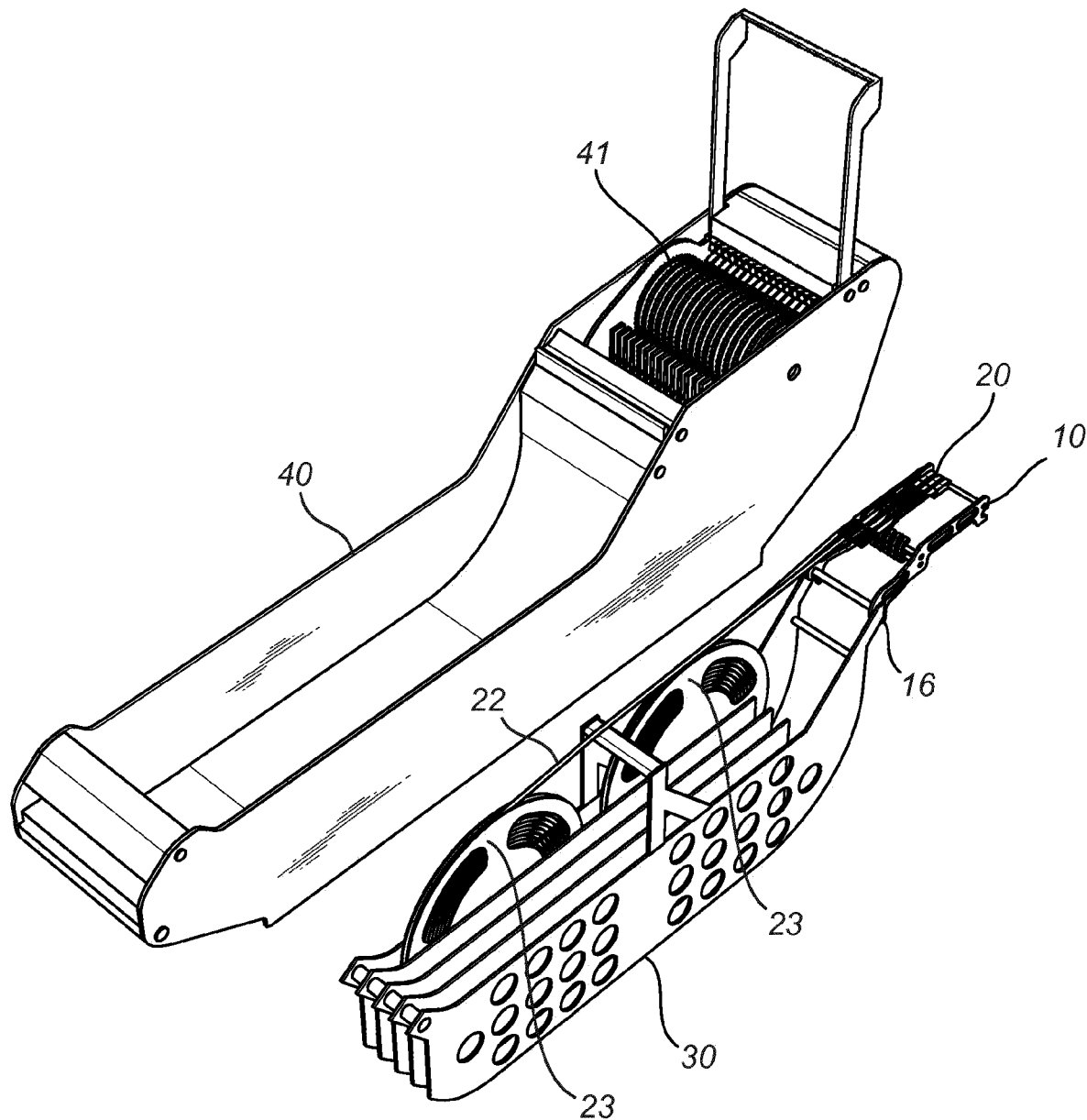
FIG. 4 illustrates a perspective view of the holder arrangement attached to a tape bin according to an embodiment of the present disclosure.

In FIG. 4, a holder arrangement 10 is shown which may be similarly configured as the holder arrangement 10 shown in FIGS. 2 and 3. In the present example, the holder arrangement 10 is attached to a carrier or bin 30, carrying component tape reels 23. The holder arrangement 10 is releasably attached to the bin 30 by means of a second locking element 16. The bin 30 may comprise a handle 32, or gripping means, for facilitating handling and transport of the bin 30. The bin 30 can for example be loaded in a magazine 40 configured to be inserted in a component mounting machine. In FIG. 4, the bin 30, carrying the component tape reels 23 and the holder arrangement 10 with the plurality of feeders 20, has not yet been loaded into the magazine 40.

Figure 5:
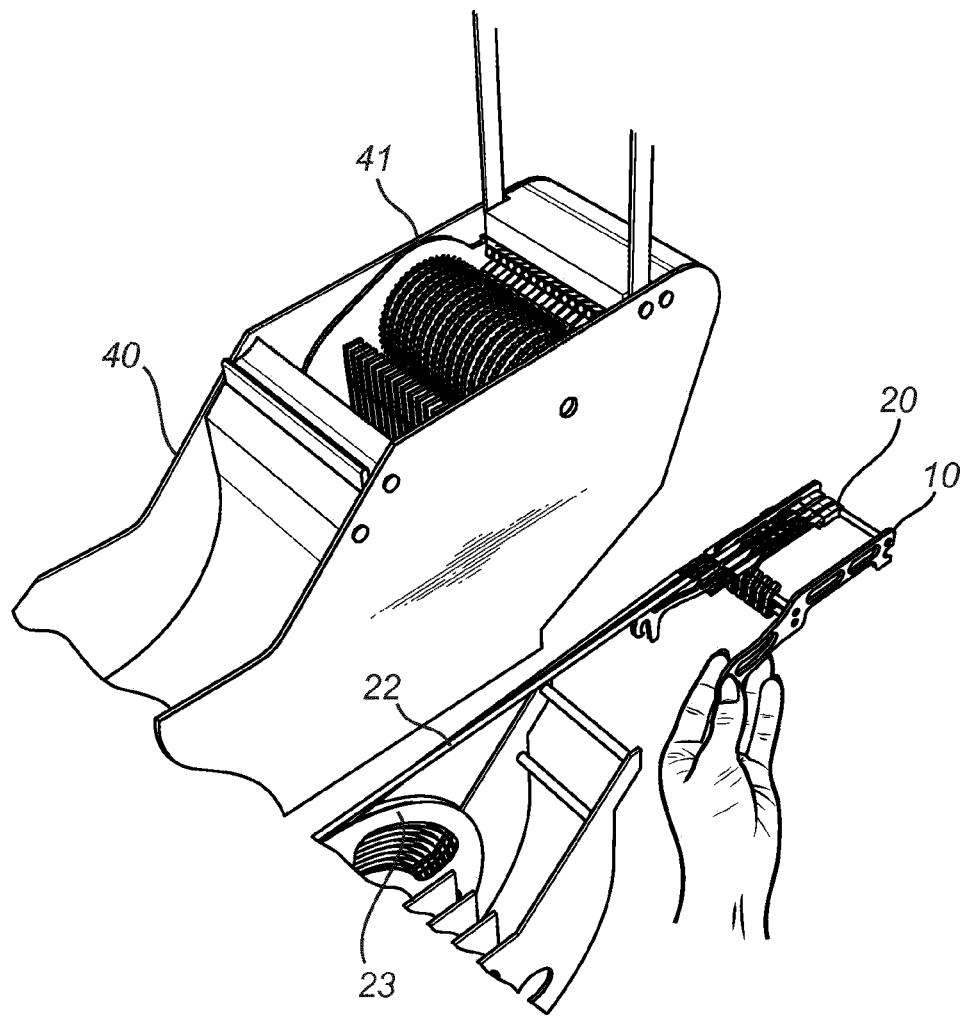
FIG. 5 illustrates a perspective view of the holder arrangement according an embodiment of the present disclosure.

In FIG. 5, the holder arrangement 10 of FIG. 4 has been released from the bin 30 by an operator. As shown in the figure, the component feeders 20, and hence the tape mounted in the feeders, are still attached to the holder arrangement 10.

Figure 6:
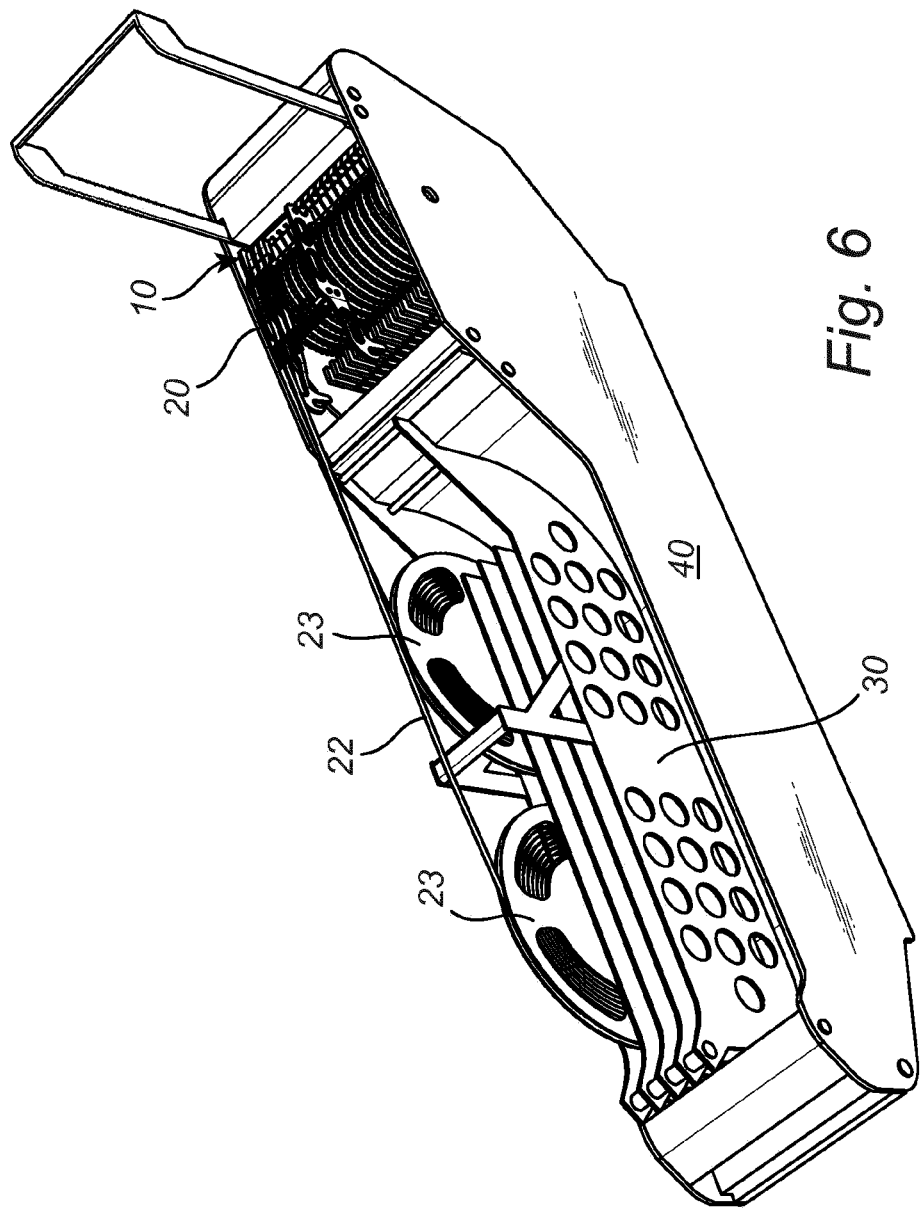
FIG. 6 illustrate a perspective view of the tape bin arranged in the component magazine, and wherein the holder arrangement is attached to the component magazine.

FIG. 6 illustrates a holder arrangement 10, which may be similarly configured as the embodiments described in connection with the previous figures, when attached to the component magazine 40. The tape bin 30, carrying the component tape reels 23, may be accommodated in the magazine 40. This magazine 40 may then be loaded into a component mounting machine.

The component magazine 40 may comprise an electrical means and a drive mechanism 41 for feeding the component tape 22 towards the picking position of the component mounting machine. The electrical means may include communicating means adapted to communicate with the component feeders 20 by means of a wired or wireless connection. The communication may include retrieving information relating to e.g. component type, component width, tape type or component feeder 20 identity such that the magazine may adapt its configurations to fit the feeder in use.

In a typical use case, a person may first attach the feeders 20 to the holding arrangement 10, then attach the second locking element 16 of the holding arrangement 10 to the tape bin 30 that accommodates the tape reels 23, carry the tape bin 30 to the magazine 40, move the tape bin into the magazine 40, detach the second locking element 16 from the tape bin 30 and attach the first locking element 11 to the magazine 40. The magazine 40 may then be loaded into the component mounting machine for mounting the components from the feeders 20.

Thus, a holder arrangement in accordance with the present disclosure allows for an easy handling and quick replenishment of feeders. In the above, the inventive concept has mainly been described with reference to a limited number of examples. However, as is readily appreciated by a person skilled in the art, other examples than the ones disclosed above are equally possible within the scope of the inventive concept, as defined by the appended claims.

ITEMIZED LIST OF EMBODIMENTS

1. A holder arrangement (10) for releasably holding a plurality of component feeders (20) configured to feed a component tape towards a picking position of a component mounting machine, the arrangement comprising:
    a first mechanical interface (12) configured to releasably attach the plurality of component feeders to the holder arrangement; and a second mechanical interface (15) configured to releasably attach the holder arrangement to a component tape magazine (40) configured to be loaded into the component mounting machine.

2. A holder arrangement (10) for releasably holding a plurality of component feeders (20) configured to feed a component tape towards a picking position of a component mounting machine, the arrangement comprising: a first mechanical interface (12) configured to releasably attach the plurality of component feeders to the holder arrangement; and a second mechanical interface (15) configured to releasably attach the holder arrangement to a component tape magazine (40) configured to be loaded into the component mounting machine, such that the component feeders are positioned to guide the component tape to the picking position.

3. A holder arrangement (10) for releasably holding a plurality of component feeders (20) configured to feed a component tape towards a picking position of a component mounting machine, the arrangement comprising:

a first mechanical interface (12) configured to releasably attach the plurality of component feeders to the holder arrangement when said plurality of component feeders guide the component tape to the picking position; and a second mechanical interface (15) configured to releasably attach the holder arrangement to a component tape magazine (40) configured to be loaded into the component mounting machine.

4. A holder arrangement (10) for releasably holding a plurality of component feeders (20) configured to feed a component tape towards a picking position of a component mounting machine, the arrangement comprising:

a first mechanical interface (12) configured to releasably attach the plurality of component feeders to the holder arrangement; and a second mechanical interface (15) comprising a first locking element and a second locking element and configured to releasably attach the holder arrangement to a component tape magazine (40) configured to be loaded into the component mounting machine.

5. The holder arrangement according to any of items 1-4, wherein the first mechanical interface comprises a first locking means (13) and a second locking means (14), wherein the first locking means is configured to cooperate with the second locking means to releasably attach the plurality of component feeders to the holder arrangement.

6. The holder arrangement according to item 5, wherein the first locking means is separated from the second locking means in a feeding direction (F) of the component feeders.

7. The holder arrangement according to item 6, wherein the first locking means comprises a plurality of locking members, each of which being configured to cooperate with the second locking means to releasably attach a respective component feeder to the holder arrangement.

8. The holder arrangement according to item 7, wherein:
each one of the locking members is spring loaded to exert a force pushing the respective component feeder towards the second locking means.

9. The holder arrangement according to item 7 or 8, wherein the locking members are pivotable around an axis transverse to the feeding direction.

10. The holder arrangement according to any one of items 7 to 9, wherein a position of each one of the locking members is adjustable along an axis (L) transverse to the feeding direction.

11. The holder arrangement according to any one of items 7 to 10, wherein each one of said locking members comprises an interlocking structure configured to cooperate with a corresponding interlocking structure of the respective component feeder and to allow the component feeder to be snapped into a locking position, in which the component feeder is attached to the holder arrangement.

12. The holder arrangement according to any one of the preceding items, wherein the first mechanical interface is configured to hold the plurality of component feeders side by side.

13. The holder arrangement according to any one of the preceding items, configured to hold the plurality of component feeders when a component tape is mounted in at least one of said component feeders.

14 The holder arrangement according to any one of items 5 to 13, wherein the second locking means is configured to allow a pivotal engagement with the component feeders.

15. The holder arrangement according to any one of items 5 to 14, wherein the second locking means comprises a rod extending in a direction transverse to the feeding direction, and wherein said rod is configured to engage with a corresponding recess of each one of said component feeders.

16. The holder arrangement according to any one of the preceding items, wherein the second mechanical interface comprises a first locking element and a second locking element, wherein at least one of said first locking element and said locking element is configured to be snapped into a locking position in which the holder arrangement is attached to the component tape magazine.

17. The holder arrangement according to any one of the preceding items, wherein the second mechanical interface is further configured to releasably attach the holder arrangement to a portable carrier, wherein said portable carrier is configured to hold a plurality of component tape reels, to be accommodated by the component tape magazine, and to be transported separately from the component tape magazine.

18. A component mounting machine (30) comprising:
a holder arrangement for releasably holding a plurality of component feeders (20) according to any one of items 1-14; and
a component tape magazine (40) comprising a drive mechanism (41) for moving the component tape mounted in at least one of said plurality of component feeders towards the picking position of the component mounting machine.

19. A method for handling at least one component feeder configured to feed a component tape towards a picking position of a component mounting machine, wherein said at least one component feeder is arranged to be releasably held by a holder arrangement, the method comprising;
attaching the at least one component feeder to the holder arrangement by means of a first mechanical interface (12);
attaching the holder arrangement to a tape bin by means of a second mechanical interface (15); carrying said tape bin to the tape magazine and moving said tape bin into the magazine configured to be loaded into the component mounting machine;
detaching the holder arrangement from the tape bin and attaching said holder arrangement to the magazine by means of the second mechanical interface (15); and
loading the magazine into the component mounting machine for at least one component feeder to feed the component tape to the picking position of the component mounting machine.

The invention claimed is:

1. A holder arrangement for releasably holding a plurality of component feeders that are each configured to feed a separate component tape towards a picking position of a component mounting machine, the holder arrangement comprising:
   a first mechanical interface configured to releasably attach the plurality of component feeders to the holder arrangement; and
   a second mechanical interface configured to releasably attach the holder arrangement to a component tape magazine configured to be loaded into the component mounting machine, the second mechanical interface configured to releasably attach the holder arrangement to the component tape magazine independently of the plurality of component feeders, such that the plurality of component feeders are positioned to guide separate, respective component tapes to the picking position based on operation of the component tape magazine, based on the plurality of component feeders remaining releasably attached to the holder arrangement while the holder arrangement is releasably attached to the component tape magazine independently or the plurality of component feeders.

2. The holder arrangement according to claim 1, wherein the first mechanical interface comprises a first locking means and a second locking means, wherein the first locking means is configured to cooperate with the second locking means to releasably attach the plurality of component feeders to the holder arrangement.

3. The holder arrangement according to claim 2, wherein the first locking means is separated from the second locking means in a feeding direction of the plurality of component feeders.

4. The holder arrangement according to claim 3, wherein the first locking means comprises a plurality of locking members, each of which being configured to cooperate with the second locking means to releasably attach a respective component feeder of the plurality of component feeders to the holder arrangement.

5. The holder arrangement according to claim 4, wherein:
   each one of the locking members is spring loaded to exert a force pushing the respective component feeder of the plurality of component feeders towards the second locking means.

6. The holder arrangement according to claim 4, wherein the locking members are pivotable around an axis transverse to the feeding direction.

7. The holder arrangement according to claim 4, wherein a position of each one of the locking members is adjustable along an axis transverse to the feeding direction.

8. The holder arrangement according to claim 4, wherein each one of said locking members comprises an interlocking structure configured to cooperate with a corresponding interlocking structure of the respective component feeder of the plurality of component feeders and to allow the respective component feeder of the plurality of component feeders to be snapped into a locking position, in which the respective component feeder of the plurality of component feeders is attached to the holder arrangement.

9. The holder arrangement according to claim 2, wherein the second locking means is configured to allow a pivotal engagement with the plurality of component feeders.

10. The holder arrangement according to claim 2, wherein the second locking means comprises a rod extending in a direction transverse to a feeding direction of the plurality of component feeders, and wherein said rod is configured to engage with a corresponding recess of each one of said plurality of component feeders.

11. The holder arrangement according to claim 1, wherein the first mechanical interface is configured to hold the plurality of component feeders side by side.

12. The holder arrangement according to claim 1, configured to hold the plurality of component feeders when a component tape is mounted in at least one of said component feeders.

13. The holder arrangement according to claim 1, wherein the second mechanical interface comprises a first locking element and a second locking element, wherein at least one of said first locking element and said second locking element is configured to be snapped into a locking position in which the holder arrangement is attached to the component tape magazine.

14. The holder arrangement according to claim 1, wherein the second mechanical interface is further configured to releasably attach the holder arrangement to a portable carrier, wherein said portable carrier is configured to hold a plurality of component tape reels, to be accommodated by the component tape magazine, and to be transported separately from the component tape magazine.

15. A component mounting machine comprising:
   a holder arrangement for releasably holding a plurality of component feeders according to claim 1; and
   a component tape magazine comprising a drive mechanism for moving a component tape mounted in at least one of said plurality of component feeders towards a picking position of the component mounting machine.

16. A method for handling at least one component feeder configured to feed a component tape towards a picking position of a component mounting machine, wherein said at least one component feeder is arranged to be releasably held by a holder arrangement, the method comprising;
   attaching the at least one component feeder to the holder arrangement by means of a first mechanical interface;
   attaching the holder arrangement to a tape bin using a second mechanical interface;
   carrying said tape bin to a tape magazine and moving said tape bin into the tape magazine, the tape magazine configured to be loaded into the component mounting machine;
   detaching the holder arrangement from the tape bin while the at least one component feeder remains attached to the holder arrangement and attaching said holder arrangement to the tape magazine using the second mechanical interface independently of the at least one component feeder and while the at least one component feeder remains attached to the holder arrangement, such that that the at least one component feeder is positioned to guide the component tape to the picking position based on operation of the tape magazine, based on the at least one component feeder remaining attached to the holder arrangement while the holder arrangement is attached to the tape magazine independently of the at least one component feeder; and
   loading the tape magazine into the component mounting machine for the at least one component feeder to feed the component tape to the picking position of the component mounting machine.

* * * * *